United States Patent [19]

Raffel et al.

[11] 4,127,900
[45] Nov. 28, 1978

[54] READING CAPACITOR MEMORIES WITH A VARIABLE VOLTAGE RAMP

[75] Inventors: Jack I. Raffel; John A. Yasaitis, both of Lexington, Mass.

[73] Assignee: Massachusetts Institute of Technology, Cambridge, Mass.

[21] Appl. No.: 808,068

[22] Filed: Jun. 20, 1977

Related U.S. Application Data

[63] Continuation-in-part of Ser. No. 737,165, Oct. 29, 1976.

[51] Int. Cl.² .................. G11C 7/00; G11C 11/24
[52] U.S. Cl. ................................ 365/191; 365/149
[58] Field of Search .............. 340/173 CA; 357/23; 365/149, 191

[56] References Cited

U.S. PATENT DOCUMENTS

| | | | |
|---|---|---|---|
| 3,416,143 | 12/1968 | Goethem et al. | 340/173 CA |
| 3,590,337 | 6/1971 | Wegener | 357/23 |
| 3,859,642 | 1/1975 | Mar | 340/173 CA |
| 3,911,464 | 10/1975 | Chang et al. | 340/173 CA |

OTHER PUBLICATIONS

Gregor, Capacitor Storage Cell, IBM Technical Disclosure Bulletin, vol. 12, No. 1, 6/69, p. 202.

Primary Examiner—Stuart N. Hecker
Attorney, Agent, or Firm—Arthur A. Smith, Jr.; Gary A. Walpert

[57] ABSTRACT

An improved method for reading metal dual insulator semiconductor capacitor memories is disclosed. The memory contains a plurality of capacitor cells, each cell comprising a semiconductor substrate layer and a high conductivity layer sandwiching two insulator layers. The substrate is doped to provide avalanche breakdown in a surface depletion layer at a voltage comparable to the write voltage in the accumulation direction. According to the invention, a small variable voltage is applied across a selected cell or cells. The range of voltage includes a "flat-band" portion of the hysteresis loop describing the voltage-capacitance relationship for the capacitor memory. The unselected cells are maintained in a depletion state in which their capacitance is a minimum. A change or the absence of a change in the current through the capacitor indicates the state of the capacitor cell.

15 Claims, 5 Drawing Figures

U.S. Patent  Nov. 28, 1978  4,127,900
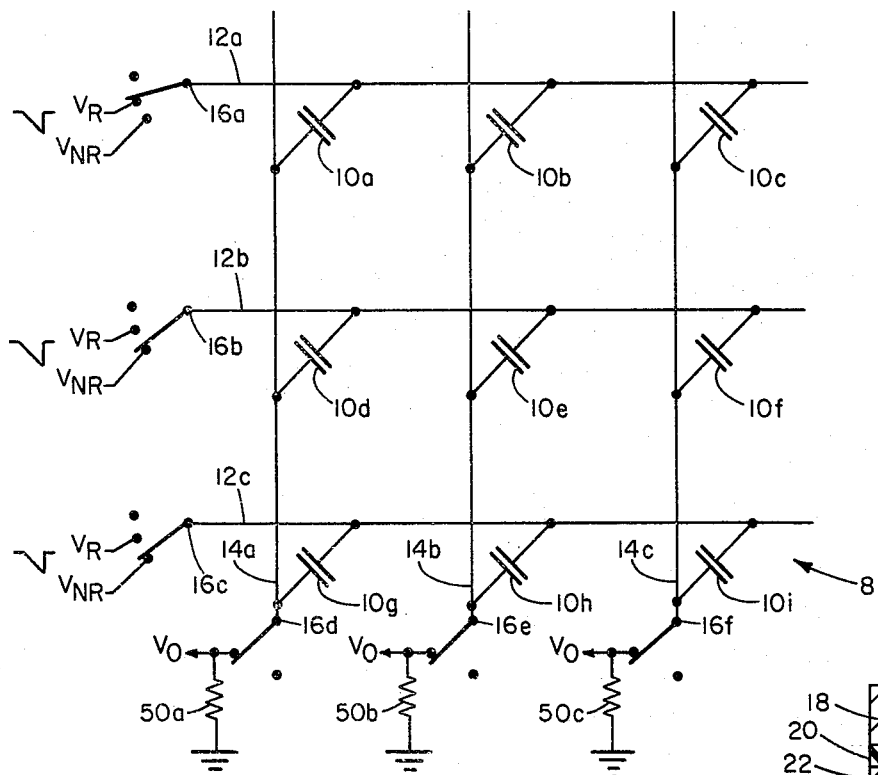
FIG. 1
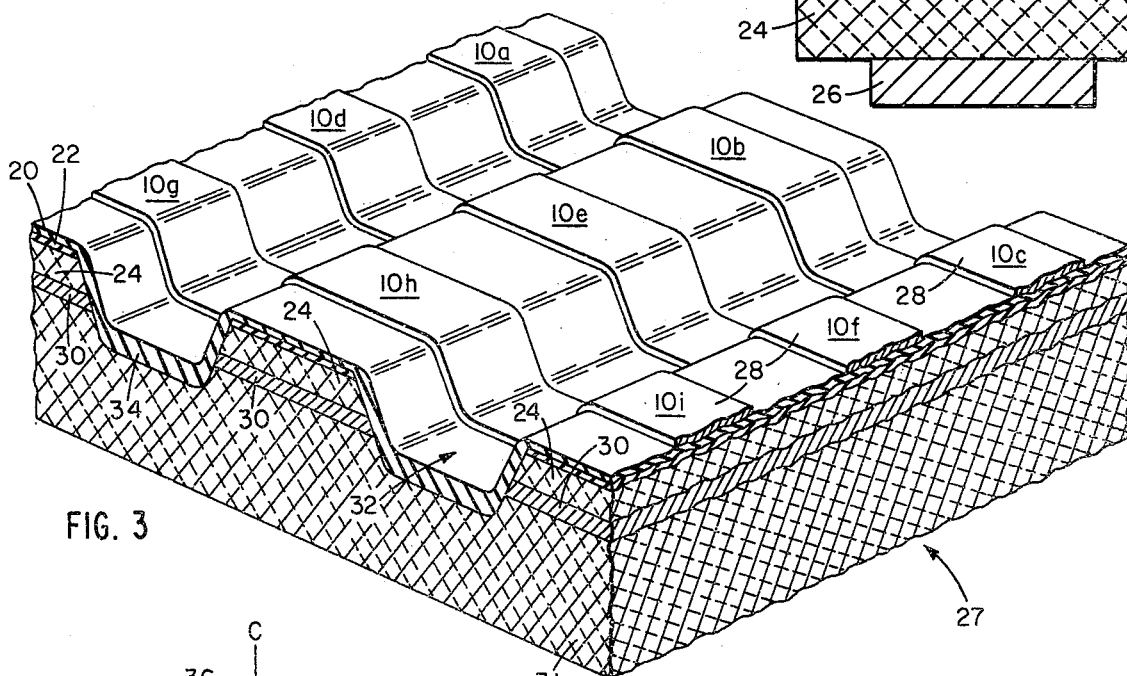
FIG. 2
FIG. 3
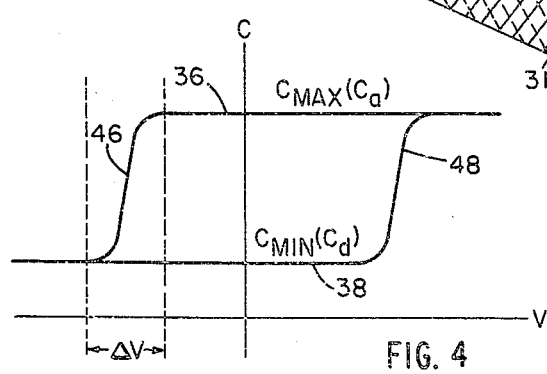
FIG. 4
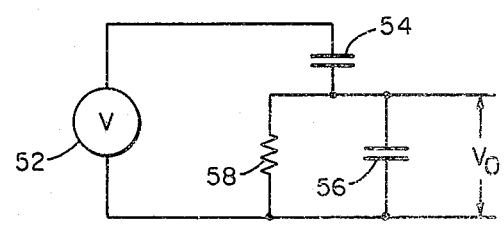
FIG. 5

READING CAPACITOR MEMORIES WITH A VARIABLE VOLTAGE RAMP

The Government has rights in this invention pursuant to Contract No. AF19(628)-76-C-0002 awarded by the Department of the Air Force, Electronic Systems Division.

CROSS REFERENCE TO RELATED APPLICATION

This application is a continuation-in-part of copending application Ser. No. 737,165, filed on Oct. 29, 1976, whose complete disclosure is incorporated herein by reference.

BACKGROUND OF THE INVENTION

This invention relates to a method for reading semiconductor memories and in particular to an improved method for reading metal dual insulator semiconductor memory arrays in which each memory cell is a capacitor which exhibits hysteresis under a varying applied voltage.

Semiconductor memories have been in existence for many years. They generally comprise a plurality of semiconductor elements organized into a regular cellular array which is fabricated on a single chip. Each cell is capable of storing one binary digit or one bit. Each cell may typically be a complex structure, often including three or more terminals to effect reading and writing of the memory.

While prior art semiconductor memories have been useful, they have generally consisted of relatively complex configurations. This increases the cost of fabrication and the size of each cell.

Dual dielectric capacitor memories have been suggested to decrease both cost of fabrication and size. Generally however they have not succeeded in providing practical structures and methods for selectively reading and writing at high speeds.

Dual dielectric capacitor memories are desirable however because they have the potential of providing extremely high densities in a cross-point addressing lattice and require zero standby power and negligible refresh power.

At present, the generally preferred MIS capacitor memories most often use a four layer metal-nitride-oxide-silicon (MNOS) structure (a dual insulator, MIS capacitor).

As in any MIS structure, the MNOS capacitor has a capacitance which is voltage dependent. Unlike devices having a single dielectric layer, such as MOS capacitors, however, the capacitance versus voltage curve of the MNOS device exhibits hysteresis which arises from trapping of charge near the interface between the two dielectric layers. This trapped charge, whose magnitude depends on the duration and magnitude of applied voltage, effectively provides a bias voltage which corresponds to a shift of the voltage-capacitance relationship along the voltage axis corresponding to a change in the "flat band" voltage.

The charge storage in an MNOS capacitor arises from a net imbalance in the currents which flow in the nitride and oxide layers respectively. Current flow in the oxide is primarily tunneling and current flow in the nitride is primarily Poole-Frenkel conduction. The tunneling mechanism in the oxide layer and the Poole-Frenkel conduction mechanism in the nitride layer are extremely non-linear with field. Thus small changes in thickness and dielectric fabrication conditions can lead to a higher current in a selected one of the two dielectrics. In one condition, if the oxide current exceeds the nitride current, then a positive pulse at the metal terminal causes more electrons to enter the oxide than leave the nitride and a net negative charge can build up at the nitride-oxide interface. A negative pulse at the metal terminal can leave a net positive charge at the interface. Conversely, if the nitride current exceeds the oxide current, a positive pulse produces a positive change in charge and a negative pulse results in a negative change in stored charge. The two modes described above are referred to as the forward (or normal) mode (oxide current greater than nitride current) and the reverse (or complementary) mode (oxide current less than nitride current). A binary "1" or "0" can be associated with any two arbitrarily selected storage states.

In practice, the straight-forward prior art approach to writing by applying different potential polarities and thereby creating different charge storage states is of limited usefulness. For example, operating in the forward mode, the speed with which the quantity of stored charge can be changed in the positive direction at the nitride-oxide interface in response to a negative pulse is limited to about a few milliseconds in a typical N-type MNOS capacitor cell. In contrast, the time required to build up stored charge in the negative direction in the device, in a practical system, can be as low as one microsecond or less with a thirty volt pulse. This striking difference in charging times is due to the creation of a small series capacitance in the semiconductor substrate as a negative voltage is applied to an MNOS capacitor formed on N-type silicon. A capacitor is formed by the depletion of the silicon nearest the oxide of electrons under the influence of the field which repels electrons from the metal. This depletion effectively places a high impedance (low capacitance) in series with the dual dielectric capacitance (the nitride and oxide layers). Thus, the prior art approach to writing is limited because this series depletion capacitance soaks up most of the voltage applied across the MNOS device, leaving relatively little voltage available across the nitride-oxide layers to provide the currents needed for writing in the negative direction. (A positive pulse applied to a P-type substrate produces a similar effect.) After a sufficiently long time (typically milliseconds) an inversion layer will form causing the substrate capacitance to return to its high value and permitting dielectric currents to flow. The asymmetry in writing speeds for two selected storage states is a significant deterrent to the use of capacitors in read-write memories.

Reading or determining the state of a capacitor memory cell has, in the past, been implemented by measuring the absolute capacitance of the cell and correlating it to the capacitance-voltage hysteresis loop. The read techniques vary but are generally characterized by applying a small AC signal across the capacitor cell and measuring the resulting current. After adjusting the measurements for background parasitic and coupling capacitances, the resulting measurement of current provides a measure of the capacitance and hence the state of the cell.

Unfortunately, measuring or "reading" the absolute capacitance of a cell is, in practice, extremely difficult because the parasitic, coupling and other capacitances inherent in a very large array tend to swamp the relatively small cell capacitance and thus provide a very low signal to noise ratio.

Copending application Ser. No. 737,165 noted above of which this application is a continuation-in-part discloses and claims a capacitor memory array and methods for reading and writing in the array which substantially overcome the basic problems which existed in the past in connection with capacitor arrays. Even though the method of reading the capacitor described in that copending application is a significant advance over the prior art, still further improvements are possible.

It is therefore an object of this invention to provide an improved method for reading a capacitor memory array which provides, without additional cost in either complexity or equipment, a substantially improved output signal in the read mode. Other objects of the invention are to provide a method for reading which does not depend on the absolute value of capacitance of the individual cell and which does not disturb the information stored in unselected cells which may share the same word and/or digit lines associated with the selected cell.

SUMMARY OF THE INVENTION

The invention features an improved process for reading a multi-layer, dual dielectric, capacitor memory array. The array comprises a plurality of isolated capacitor cells and a plurality of bit lines and a plurality of word lines connecting conductive portions of groups of capacitor cells. The process features the steps of applying a variable potential between the word line and bit line uniquely identifying a cell selected to be read, and varying the potential across at least a "flat-band" portion of the known voltage-capacitance relationship for the cells. This relationship is known from the operating parameters of the system or by experimentation. The maximum magnitude of the variable potential is maintained sufficiently small so that the charge present in the selected cell is not substantially changed. Substantially all of the unselected cells are biased into a depletion state to reduce their effective capacitance. The current flowing through the selected capacitor cell is measured versus voltage as a function of time and the state of the capacitor cell is determined by the shape of the current versus time profile. In a preferred embodiment, the varying voltage is a ramp which is varied in the direction of depletion.

In a preferred embodiment of the invention, the process features the steps of applying a variable voltage ramp potential across the word and digit line identifying a selected cell, placing a resistor in a series connection with the selected cell, and biasing substantially all unselected cells connected to the resistor through the lines into a depletion state. Thus, those unselected cells connected to the resistor are biased into the depletion state and each of the remaining unselected cells may be in either the accumulation or depletion state.

DESCRIPTION OF THE DRAWINGS

Other advantages, features, and objects of the invention will appear from the following description taken together with the drawings in which:

FIG. 1 is an electrical schematic representation of a capacitor memory according to the invention;

FIG. 2 is a simplified cross-sectional view of a single capacitor cell;

FIG. 3 is a perspective view of a preferred memory structure according to the invention;

FIG. 4 is a typical capacitance versus voltage hysteresis loop for a dual insulator MIS capacitor; and FIG. 5 is an equivalent circuit representation of an $n \times n$ capacitor array during the read mode.

DESCRIPTION OF A PREFERRED EMBODIMENT

Referring to FIG. 1, a typical capacitor memory array 8 includes a plurality of capacitor cells 10 arranged in a rectilinear pattern or array. Each capacitor cell $10a, 10b, \ldots, 10i$, is connected to one of a plurality of word lines $12a, 12b, 12c$, and to one of a plurality of digit or bit lines $14a, 14b, 14c$. The connections are made so that each pair or set of word and digit lines identifies one and only one capacitor cell. While only nine cells are illustrated in FIG. 1, the array could be extended to any practical limit.

In general, each word line and each digit line can be connected independently to any of a plurality of signals to apply selected potentials across the capacitor cells in order to write information into the cells and to read information from the cells. The ability to vary the potential on the word and digit lines is illustrated schematically by switches $16a, 16b, \ldots, 16f$ (however the write voltages have been omitted for clarity).

Referring to FIG. 2, each capacitor cell 10 consists of a plurality of layers, a first high conductivity layer 18, a first dielectric insulating layer 20, a second dielectric insulating layer 22, and a semiconductor substrate 24. A second high conductivity layer 26 is connected to semiconductor substrate 24. Conductivity layers 18 and 26 form part of word and digit lines 12 and 14.

Referring to FIG. 3, a preferred capacitor memory array is a planar array 27 of isolated MNOS capacitors, assembled on a single monocrystalline substrate. In the particular embodiment shown, the first high conductivity layer 18 of each cell is formed as a part of metal strips 28, for example aluminum, which interconnect groups of capacitor cells into words. The strips 28 form the word lines 12.

Metal strips 28 overlie at each capacitor cell 10, the dielectric insulating layer 20, for example, silicon nitride. This insulating layer is preferably about 500 Angstroms thick. Other dielectric insulators could also be used. The dielectric insulating layer 20 overlies the thin dielectric layer 22 which may be a silicon dioxide layer which is thermally grown on a silicon semiconductor substrate. The silicon dioxide layer is a thin layer, in the range of about 15–50 Angstroms thick. The underlying substrate 24 is preferably comprised of an "N"-type silicon epitaxial layer which is grown on a highly doped silicon, arsenic diffused "N+" digit or bit line 30. (A P-type substrate could also be used.) The doping concentration of the substrate 24 is preferably in the range $1 \times 10^{17}$ to $4 \times 10^{15}$ impurity atoms/cc to provide avalanche breakdown voltage in the range from 6 to 50 volts as discussed in detail in copending application Ser. No. 737,165. Lines 30 correspond to bit or digit lines 16 of FIG. 1. Digit lines 30 are formed in support substrate 31. An etched cut 32 over which is grown field oxide 34 isolates the capacitor cells in a direction transverse to digit lines 30. In the preferred embodiment, the capacitor cells operate in the forward or normal mode and the oxide layer is preferably about 20 Angstroms thick. In other applications, it may be desirable to operate in the reverse of complementary mode and the oxide layer would then be on the order of 50 Angstroms thick.

As noted above, the preferred type of capacitor memory cell in the MNOS capacitor. This device, as is well known in the art, provides the capability of storing charge in the silicon nitride layer, at substantially the interface between the silicon nitride and the silicon dioxide layers (the nitride-oxide interface). The magnitude and polarity of charge affects the capacitance of the cell as a function of voltage because it in effect biases the cell onto one or the other leg of a hysteresis loop which describes the voltage-capacitance relationship in the cell. (See FIG. 4.) The hysteresis phenomenon is discussed in detail in copending application, Ser. No. 737,165, incorporated herein by reference. The state of charge (magnitude and polarity) at the cell interface is used in the present invention to represent a binary "0" or "1" in the memory.

THE READ OPERATION

As described in copending application Ser. No. 737,165, and referring to FIG. 4, a method of reliably and quickly determining the state of the capacitor cell uses a signal which varies across one of the "flat-band" portions 46, 48 of the hysteresis loop describing the cell. The varying signal is applied across the capacitor cell to be read. As a consequence, it is the presence or absence of a change of capacitance which determines the state of the capacitor cell. Since the parasitic and coupling capacitances associated with the array are linear elements (or constant capacitances), they do not contribute to the measurement of a change of capacitance and for that measurement do not reduce the signal to noise ratio of the system.

According to copending application Ser. No. 737,165, preferably, the variable signal is a ramp having a constant slope and having a duration greater than the resistance-capacitance time constant of the components of the read circuit. Since a capacitor acts as a voltage differentiator, the current passing through a capacitor, when the voltage is a ramp, is proportional to capacitance. Therefore, the output current (or voltage $V_o$ in the circuit arrangement shown in FIG. 1) is substantially proportional to the capacitance of the system as a function of voltage so long as the time duration of the ramp, $\Delta T$, is much greater than about $nCR$; where n is the number of word lines or bit lines, C is the capacitance of a cell, and R is the resistance value of a resistor 50a, 50b, . . . , in series with the selected capacitor cell. This relationship is described in greater detail below. Since the amplitude range of the variable voltage includes one "flat-band" voltage portion of the hysteresis curve, either portion 46 or 48, the profile of the voltage output, $V_o$ versus time across small resistor 50 in series with the selected capacitor cell, will, by the presence or absence of a sudden change of voltage, indicate the existence or absence of a change in capacitance and therefore whether the capacitor is on one or the other leg of the hysteresis curve. The detection problem is therefore greatly simplified since only a relative change in voltage or current (which are, in the preferred embodiment, proportional to capacitance) must be identified; the precise value of the voltage or current is not important. This technique is particularly useful because as noted above, the other capacitances in the system, which tend to hide the true capacitance of the capacitor cell, are constant.

In the read method disclosed in copending application Ser. No. 737,165, the word and digit or bit lines of the cells which are not read during the read operation are grounded and do not interfere with the capacitance reading of the selected cell. Furthermore, neither the selected nor the unselected cells are "disturbed" by the read operation because the magnitude of the read voltage applied to those cells during the read operation is not sufficient to change the state of the cells and also because the applied voltage is preferably varied in the direction of depletion.

Referring to FIG. 5, the equivalent circuit of an $n \times n$ capacitor array, during the preferred read operation described in copending application Ser. No. 737,165, comprises a voltage source 52, a selected capacitor 54, a capacitor 56 whose capacitance $C_T$ represents the cumulative capacitance of the unselected cells and a resistor 58. The output voltage, $V_o$, is measured across resistor 58. The capacitance $C_T$ of capacitor 56 is substantially equal to $(n-1)$ C where n equals the number of word lines and C is the capacitance of a cell. If the capacitance of the capacitor 54 is also C, the output $V_o$ of this circuit, in response to a ramp input is $$V_o = KRC(1-e^{-t/nRC}) \quad t > 0 \quad (1)$$

where K is the slope of the applied ramp. There are thus two interrelated conditions which affect the read operation. First, the read time both before and after crossing the flat-band portion of the known hysteresis curve should be greater than "nRC" (as noted above) to minimize the effect of the time varying term in the voltage output; and second, the output voltage is proportional to the slope of the ramp, which is turn is inversely proportional to the time duration of the ramp (this assumes that the maximum voltage range of the ramp is limited so that the capacitor cells are not disturbed.) Thus, choosing the time duration $\Delta T = 10\ nRC$, and a ramp slope K equal to $(\Delta V/\Delta T)$, $V_o \approx (\Delta V/10n)$ (the time varying term being negligible).

One method for improving the read operation, according to the invention, is to guarantee that the unselected bits, or at least the unselected bits on the digit or bit lines corresponding to the selected cell, are biased into a depletion state. The resulting circuit is advantageous substantially irrespective of the time varying input. In particular, with respect to a ramp input, the capacitance $C_T$ of capacitor 56 equals $(n-1) C_d$ (where $C_d$ is the depletion capacitance of a capacitor cell) and the resulting output voltage $V_o$ of the circuit of FIG. 5 is $$V_o = KRC\left(1 - e^{-\frac{t}{R(C + (n-1)(C_d)}}\right) \quad (2)$$

Importantly, the read time, that is the time duration of the ramp, can therefore be reduced to a time $\Delta T \approx 10\ nRC_d$ and the corresponding output voltage (the time varying term being negligible) is $$V_o \approx \frac{\Delta V\ RC}{10nRC_d} = \frac{\Delta V}{10n}\ \frac{C}{C_d} \quad (3)$$

Typically, depending upon the substrate doping, $(C_a/C_d)$ ($C_a$ is the capacitance of a cell in the accumulated state) may be on the order of ten to one, thus providing up to a ten times improvement in output voltage and up to a ten times decrease in the read time.

It is thus possible to provide both a larger output voltage $V_o$, thereby making recognition of the read signal easier and a decreased read time by guaranteeing that the unselected cells on the same bit or digit line (in the disclosed embodiment) as the selected cells are in the depletion state.

A preferred embodiment according to the invention for obtaining an output voltage which is proportional to the current passing through a capacitor cell is shown in FIG. 1. A read voltage $V_R$ is connected to the word line of the capacitor cells being read. At the same time, the other word lines are connected to a voltage $V_{NR}$ equal to −15 volts in this embodiment. The read voltage in the preferred embodiment is a voltage ramp having a time duration of for example one-half microsecond or less and a voltage range of from 3 to 10 volts in magnitude and originating from −10 to +10 volts depending upon the location of the flat-bands and the method used for signal discrimination. Longer read times could of course be used. All of the digit or bit lines, according to a preferred embodiment of the invention are connected to ground, during a read operation, through small resistors 50a, 50b, 50c, which may be, for example, 20,000 ohms. As described above, a voltage $V_o$ developed across a resistor 50 is essentially proportional to the current through and hence the capacitance of the corresponding capacitor cell connected between the selected word line and the respective digit line. In other embodiments of the invention, the unselected digit lines may be, for example, connected directly to ground. A high gain operational amplifier (not shown) is provided to amplify the output voltage $V_o$.

Thus, a potential difference of minus fifteen volts is applied to the unselected cells on the same digit line as the selected cell. Other potential differences could be used as long as the unselected cells are maintained in a depletion state during the read operation and as long as their state is not changed.

The output voltage versus time waveform is then examined for an abrupt change in voltage corresponding to a "flat-band" portion. For example, if the voltage ramp traverses the range $\Delta V$ (FIG. 4), then output $V_o$ will display a shift in voltage if the cell is in a state corresponding to a capacitance of flat-band 46 and will not display a voltage shift for a capacitance state corresponding to flat-band 48. A voltage ramp corresponding to the other "flat-band" portion 48 could also be used.

A capacitor array capable of operating in accordance with the preferred embodiment of the invention can be fabricated as follows: Starting with a P-type, (100) orientation, 1 ohm-cm silicon substrate 31 (or a thin layer of intrinsic silicon substrate on sapphire), the substrate is cleaned by a standard peroxide cleaning procedure as is known in the art, and an arsenosilica film is spun onto the wafer. A shallow arsenic N + diffusion is perfomed by annealing at 1050° C. for 20 minutes. This gives a junction depth of 0.25 microns. The sheet resistance of the diffused layer 30 is about 100 ohms/square. This diffusion layer will form the digit or bit lines.

The oxides which were formed during the N + diffusion are removed by another peroxide clean and an N-type phosphorous doped epitaxial layer 24 is grown on the substrate. The epitaxial layer is 1.5 microns thick and has a doping, $N_o$, equal to $1.0 \times 10^{16}$ to provide an avalanche breakdown voltage of about 30 volts.

An N + diffusion is now made into those areas of the N-type silicon which will underlie metal connection to the digit line outside of the array. This step provides good ohmic contact between the metal connection and the underlying N-type silicon. After a standard peroxide clean, a thermal oxide is grown on the chip in an oxidizing atmosphere at 1000° C. for 3 hours. The thickness of the oxide is about 900 Angstroms. Contact cuts are etched photolithographically in the oxide and the photoresist is left on the surface for the next step. A plasma etch to remove 1000 to 2000 Angstroms of silicon in the contact cut is then made. A standard phosphorous predeposition is then performed from a phosphorous doped glass source which is thermally deposited on the chip.

A masking nitride layer, about 800 Angstroms thick, is then deposited on the N-type epitaxial layer. This nitride is deposited at a higher temperature, 850° C., than the memory nitride which will be deposited at a later stage in the process. During deposition of the masking nitride, the ammonia to silane ratio is approximately 100 to 1.

The N-type silicon mesa lines, that is, the columns of the array, are defined as follows. The nitride surface is etched using a photomask to form nitride pads on the silicon substrate. An anisotropic etch, using potassium hydroxide on the silicon subsrate, is then perfomed using the nitride as a mask to the etchant. The etch reaches down to the P-type substrate and leaves sloped sidewalls at an angle of 65° to the plane of the P-type substrate, surrounding the mesas. The sloped sidewalls are especially useful for obtaining good metal step coverage on the mesa walls. A thermal oxidation of the exposed silicon surface is then performed at 920° C. for 2 hours in oxygen and water to leave a 4000 Angstroms thick oxide layer in the cut (the masking nitride protects the mesas). This is the field oxide 34 which appears everywhere except on top of the mesas. The nitride mask is then stripped by applying a 10 to 1 solution of water to hydrofluoric acid for 1 minute and washing for 20 minutes in phosphoric acid.

The memory oxide and nitride are then grown on the silicon mesas. The bare silicon on the mesa is cleaned using a standard peroxide clean followed by a 30 second rinse in 10 to 1, water to hydrofluoric acid solution. The memory oxide 22 is grown in one of two alternate ways depending upon whether the forward shift mode or the reverse shift mode is being used. In the reverse shift mode, the surface is oxidized in an oxidizing atmosphere for 30 minutes at 800° C. to obtain an oxide thickness of about 40 Angstroms. In the forward shift mode the freshly etched silicon surface is used by itself. A thermal oxide grown in a 0.1% oxygen in nitrogen mixture at 900° C. for 10 minutes may also be suitable.

The silicon nitride layer 20 is then grown on the memory oxide 22. If the reverse shift mode is used, a conductive nitride is deposited at 700° C. with a current density of approximately 10 amperes per square centimeter at a nitride electric field of $4.8 \times 10^6$ volts/cm. This provides a write time of approximately 100 nanoseconds at 30 volts and a nitride thickness of approximately 500 Angstroms. In the forward shift mode, a less conductive nitride is deposited at 700° C. with a current density of approximately $10^{-5}$ amperes per square centimeter at a nitride electric field of $4.8 \times 10^6$ volts/cm. A nitride thickness of 500 Angstroms is also used in this operating mode. The memory nitride is removed from areas other than the actual array, that is, areas outside the regions defined by the row and column intersections, by using a photomask and etching. The nitride is also removed at periodically spaced points along the silicon mesa tops which will later be metallized.

An aluminum silicon copper layer, 0.45 micron thick, is now laid down. The silicon substrate is not heated during the metal deposition. The metal is photoetched to form metal rows of the memory array and the metal lines 28 are extended to bonding pads away from the actual array.

A 0.8 micron thick layer of phosphorous doped silicon dioxide is deposited by chemical vapor deposition from silane and oxygen. The oxide is photoetched to provide cuts through the deposited oxide to the bonding pads, and at specified points along each N-type silicon mesa. Generally, the cuts are made about once every 30 devices along the columns. A second level metal, aluminum, is then deposited and photoetched to again delineate the bonding pads. Also, metal rows equal in width and running parallel to and directly over the N-type silicon mesa tops are thereby defined.

This structure provides contact to the N-type silicon mesas at about every 30 array intersections. This reduces series resistance along the N-type silicon columns to any device to less than about 3000 ohms.

The array is then sintered at 420° C. and the oxide on the back of the wafer is removed by etching, the front being protected by a mask.

Summarizing the results of this fabrication technique, typical preferred thicknesses for the various layers are as follows:

N + layer (0.0008 ohm-cm) - 0.25 microns
N epitaxial layer (0.6 ohm-cm) - 1.5 microns
Silicon dioxide layer - 20 Angstroms
Silicon nitride layer - 500 Angstroms
Aluminum Metal Strip - 4,500 Angstroms
Field Oxide - 4,000 Angstroms The N-type epitaxial layer may be more lightly doped. The thickness of the lightly doped N epitaxial layer (about 1-2 ohm-cm) is preferably about 0.8 micron. In this circumstance, the thickness of the N epitaxial layer, not its doping level, primarily determines the potential at which avalanche breakdown occurs.

Available photolithographic techniques make possble capacitor cells spaced on 0.2 mil centers. Using the improved reading technique described above, read speeds of at least about 0.5 microsecond can be achieved.

The invention has been described in connection with a structure constructed using an N-type substrate to operate in the forward shift mode. It has also been described in a structure wherein the read voltage is applied to the word line. Other embodiments of the invention, including those wherein the array operates in the reverse mode and/or wherein a P-type substrate is used or wherein the read voltage is applied to the digit or bit lines, will occur to those skilled in the art and are within the following claims.

What is claimed is:

1. The process of reading a selected cell of a capacitor memory array, the array comprising a plurality of isolated capacitor cells, each cell including at least a first conductive layer, a first dielectric insulating layer, a second dielectric insulating layer, a doped semiconductor layer, and a second conductive layer, the first conductive layers of said cells being grouped and interconnected into a plurality of word lines and the second conductive layers of said cells being grouped and interconnected into a plurality of digit lines, one each of said digit and word lines uniquely identifying a capacitor cell, and each cell having two capacitance states, the process including the steps of
applying a variable potential between the word and digit lines identifying the selected cell, said variable potential having a voltage range extending at least in part across a "flat-band" portion of a known voltage-capacitance relationship for said cell, the maximum magnitude of said variable potential being sufficiently small so that the state of said selected cell is not changed,
biasing substantially all unselected cells into a depletion state,
measuring the current flowing through said selected capacitor cell as a function of said voltage versus time, and
determining the state of said capacitor cell from the shape of the current versus time profile.

2. The process of claim 1 wherein said second dielectric layer is a silicon dioxide layer.

3. The process of claim 1 wherein said variable potential is a voltage ramp, the time duration of said voltage ramp being greater than an RC time constant of the system being read.

4. The process of claim 3 wherein said voltage ramp is varied in the direction of depletion.

5. The process of claim 1 wherein said determining step includes the steps of
measuring a change of amplitude of said current versus time signal and
estimating from any amplitude jumps in said signal the state of the capacitor being read.

6. The process of claim 1 wherein said measuring step includes the steps of
placing a resistor in a series circuit connection with the selected cell, and
measuring the voltage drop across said resistor.

7. The process of reading a metal-nitride-oxide-silicon capacitor memory array having a plurality of digit lines and a plurality of word lines, and said memory including a plurality of cells, each cell having a plurality of charge states, including the steps of
applying a variable potential across the word line and digit line identifying a selected cell, said variable potential extending at least in part across a "flat-band" portion of a known voltage-capacitance relationship for said cell, the magnitude of said variable potential being sufficiently small so that a charge stored in said selected cell is not substantially changed,
biasing substantially all unselected cells into a depletion state,
measuring the current flowing through said selected capacitor cell as a function of said voltage versus time, and
determining the state of said capacitor cell by the shape of the current versus time profile.

8. The process of claim 7 wherein said variable potential is a voltage ramp, said voltage ramp having a time duration greater than an RC time constant of the system being read.

9. The process of claim 8 wherein said voltage ramp is varied in the direction of depletion.

10. The process of reading a metal-nitride-oxide-silicon capacitor memory array having a plurality of digit lines and a plurality of word lines, said memory including a plurality of cells, each cell having a plurality of charge states, including the steps of
applying a variable voltage ramp potential across the word and digit line identifying a selected cell, said variable potential extending at least in part across a "flat-band" portion of a known voltage-capacitance relationship for said cell, the magnitude of said variable potential being sufficiently small so that a charge stored in said selected cell is not substantially changed, placing a resistor in a series connection with said selected cell, biasing substantially all unselected cells connected to said resistor through said lines into a depletion state, measuring the current flowing through said selected capacitor cell as a function of said voltage versus time by measuring a voltage drop across said resistor, measuring a change of said voltage drop versus time, and determining from any amplitude jumps in said voltage drop signal the state of the capacitor being read.

11. The process of claim 10 wherein said variable potential is varied in the direction of depletion.

12. The process of reading a selected cell of a capacitor memory array, the array comprising a plurality of isolated capacitor cells, each cell including at least a first conductive layer, a dielectric insulating layer, a second dielectric insulating layer, a doped semiconductor layer, and a second conductive layer, the first conductive layers of said cells being grouped and interconnected into a plurality of word lines and the second conductive layers of said cells being grouped and interconnected into a plurality of digit lines, one each of said digit and word lines uniquely identifying a capacitor cell, and each cell hving two capacitance states, the process including the steps of applying a variable voltage ramp potential across the word and digit line identifying a selected cell, said variable potential extending at least in part across a "flat-band" portion of a known voltage-capacitance relationship for said cell, the magnitude of said variable potential being sufficiently small so that a charge stored in said selected cell is not changed, placing a resistor in a series connection with said selected cell, biasing substantially all unselected cells connected to said resistor through said lines into a depletion state, measuring the current flowing through said selected capacitor cell as a function of said voltage versus time, and determining the state of the capacitor cell from the shape of the voltage versus time profile.

13. The process of claim 12 wherein said voltage ramp is varied in the direction of depletion.

14. The process of claim 12 wherein said determining step includes the steps of measuring a change of amplitude of said current versus time signal and estimating from any amplitude changes in said signal the state of the capacitor being read.

15. The process of claim 12 wherein said measuring step includes the step of measuring the voltage drop across said resistor.

* * * * *